United States Patent
Ikuta et al.

(10) Patent No.: US 9,893,420 B2
(45) Date of Patent: Feb. 13, 2018

(54) WIRELESS MODULE WITH PLURAL IN-PLANE TERMINALS

(71) Applicant: ROHM CO., LTD., Kyoto-shi, Kyoto (JP)

(72) Inventors: Tomohiro Ikuta, Kyoto (JP); Yusaku Kawabata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/820,017

(22) Filed: Aug. 6, 2015

(65) Prior Publication Data

US 2015/0349416 A1 Dec. 3, 2015

Related U.S. Application Data

(63) Continuation of application No. 13/927,736, filed on Jun. 26, 2013, now Pat. No. 9,129,941.

(30) Foreign Application Priority Data

Jun. 27, 2012 (JP) .................. 2012-144093

(51) Int. Cl.
*H01L 23/48* (2006.01)
*H01L 23/52* (2006.01)
(Continued)

(52) U.S. Cl.
CPC ........... *H01Q 1/50* (2013.01); *H01L 23/3121* (2013.01); *H01L 23/48* (2013.01); *H01Q 1/2283* (2013.01);
(Continued)

(58) Field of Classification Search
CPC .............. H01L 23/3121; H01L 23/48; H01L 2924/0002; H01L 2224/48091; H01L 2224/48247; H01L 2924/01079; H01L 2924/01029; H01L 2924/3011; H01L 2924/14; H01L 2924/01078; H01L 2924/01013; H01L 23/50
(Continued)

(56) References Cited

U.S. PATENT DOCUMENTS 5,786,626 A 7/1998 Brady et al.
7,893,878 B2 * 2/2011 Rofougaran ............ H01L 23/66
343/700 MS
(Continued)

FOREIGN PATENT DOCUMENTS

JP 10-13296 A 1/1998
JP 2001-196824 A 7/2001
(Continued)

OTHER PUBLICATIONS

Office Action issued in corresponding Japanese Patent Application on Jun. 14, 2016.

*Primary Examiner* — Kimberly Rizkallah
*Assistant Examiner* — Dilinh Nguyen
(74) *Attorney, Agent, or Firm* — Hamre, Schumann, Mueller & Larson, P.C.

(57) ABSTRACT

The wireless module according to the present invention includes a wireless IC chip for processing transmission/reception signals, a substrate on which the wireless IC chip is mounted, an antenna provided on the substrate, and a plurality of terminals extending off from the substrate in an in-plane direction of the substrate.

20 Claims, 8 Drawing Sheets

(51) Int. Cl.
H01Q 1/50 (2006.01)
H01Q 21/00 (2006.01)
H01Q 1/40 (2006.01)
H01L 23/31 (2006.01)
H01Q 1/22 (2006.01)
H04B 1/40 (2015.01)

(52) U.S. Cl.
CPC ........... *H01Q 1/40* (2013.01); *H01Q 21/0006* (2013.01); *H04B 1/40* (2013.01); *H01L 2924/0002* (2013.01)

(58) Field of Classification Search
USPC ....... 257/692, 672, 676, 690, 691, 693, 784, 257/786
See application file for complete search history.

(56) References Cited

U.S. PATENT DOCUMENTS

| | | |
|---|---|---|
| 2002/0177360 A1 | 11/2002 | Nakayama |
| 2004/0053034 A1 | 3/2004 | Kordjani et al. |
| 2005/0093111 A1 | 5/2005 | Berman et al. |
| 2005/0280511 A1 | 12/2005 | Yokoyama et al. |
| 2006/0276157 A1 | 12/2006 | Chen et al. |
| 2007/0170560 A1* | 7/2007 | Gaucher .................. H01L 23/66 257/676 |
| 2008/0087902 A1 | 4/2008 | Lee et al. |
| 2009/0079641 A1 | 3/2009 | Cruzado et al. |
| 2011/0188552 A1 | 8/2011 | Yoon et al. |
| 2014/0001611 A1 | 1/2014 | Jo et al. |

FOREIGN PATENT DOCUMENTS

| | | |
|---|---|---|
| JP | 2001-352587 A | 12/2001 |
| JP | 2003-179515 A | 6/2003 |
| JP | 2003-531556 A | 10/2003 |
| JP | 2005-294885 | 10/2005 |
| JP | 2006-5633 A | 1/2006 |
| JP | 2009-524985 A | 7/2009 |
| JP | 2009-531909 A | 9/2009 |
| JP | 2010-274918 A | 12/2010 |

* cited by examiner

WIRELESS MODULE WITH PLURAL IN-PLANE TERMINALS

This application is a Continuation of U.S. Ser. No. 13/927,736, filed Jun. 26, 2013, which application is incorporated herein by reference.

BACKGROUND OF THE INVENTION

1. Field of the Invention

The present invention relates to a wireless module.

2. Description of the Related Art

When used, wireless modules for transmitting and receiving radio signals are mounted on a mount object such as a circuit board. The wireless module disclosed in Patent Document 1 (see e.g. JP-A-2005-294885) includes a substrate, an antenna as a transmitter-receiver provided on the substrate, and a transmitting/receiving device (wireless IC chip) mounted on the substrate. The antenna is electrically connected to the wireless IC chip. The substrate has a principal surface and a reverse surface facing away from the principal surface. The antenna and the wireless IC chip are arranged on the principal surface. The wireless module is surface-mounted on the obverse surface of the mount object, with the reverse surface of the substrate facing the mount object.

Since the conventional wireless module is designed to be surface-mounted, it requires a relatively large space for mounting. Further, to prevent degradation of communication quality, in surface-mounting the wireless module on a mount object, other electronic components cannot be mounted on the reverse surface of the mount object at the region corresponding to the antenna of the wireless module. Such a limitation leads to waste of space.

SUMMARY OF THE INVENTION

The present invention has been conceived under the above-described circumstances. It is therefore an object of the present invention to provide a wireless module that realizes space saving in mounting.

According to the present invention, there is provided a wireless module comprising a wireless IC chip for processing transmission/reception signals, a substrate on which the wireless IC chip is mounted, a transmitter-receiver at least a part of which is disposed on the substrate, and a plurality of terminals extending from the substrate in an in-plane direction of the substrate.

In a preferred embodiment of the present invention, the substrate has a contour including a first edge extending in a second direction perpendicular to a first direction corresponding to the thickness direction of the substrate. The terminals are arranged along the first edge, and each of the terminals extends from the first edge toward a first side in a third direction perpendicular to both of the first and the second directions.

In a preferred embodiment of the present invention, the transmitter-receiver includes a first antenna provided on a first surface of the substrate which faces to a first side in the first direction.

In a preferred embodiment of the present invention, the contour of the substrate includes a second edge spaced apart from the first edge in the third direction and parallel to the first edge. The first antenna is arranged at a position offset toward the second edge in the third direction.

In a preferred embodiment of the present invention, the contour of the substrate includes a third edge and a fourth edge each of which is connected, at their ends, to the first edge and the second edge, and the third and the fourth edges are spaced apart from each other in the second direction and parallel to each other. The transmitter-receiver includes a second antenna arranged at a position offset toward the third edge in the second direction.

In a preferred embodiment of the present invention, the first antenna is arranged at a position offset toward the fourth edge in the second direction.

In a preferred embodiment of the present invention, the first antenna and the second antenna have different radio wave directivities.

In a preferred embodiment of the present invention, each of the terminals is bent so that a region from an intermediate portion to the end extends in the first direction.

In a preferred embodiment of the present invention, the end of each of the terminals faces to a second side in the first direction.

In a preferred embodiment of the present invention, the wireless IC chip is mounted at one of a first region of the first surface of the substrate and a second region of a second surface opposite to the first surface of the substrate, where the first region excludes the region in which the transmitter-receiver is arranged, and the second region overlaps the first region as viewed in the first direction. An electronic device is mounted at the other one of the first region and the second region.

In a preferred embodiment of the present invention, the transmitter-receiver includes a third antenna projecting from the first edge of the substrate toward a first side in the third direction.

In a preferred embodiment of the present invention, the third antenna is bent so that a region from an intermediate portion to the end thereof extends in the first direction.

In a preferred embodiment of the present invention, the contour of the substrate includes a second edge spaced apart from the first edge in the third direction and parallel to the first edge. The transmitter-receiver includes a fourth antenna projecting from the second edge toward a second side in the third direction.

In a preferred embodiment of the present invention, each of the terminals is bent so that a region from an intermediate portion to the end extends in the first direction.

In a preferred embodiment of the present invention, the wireless module further comprises a resin coating covering the substrate and the wireless IC chip.

In a preferred embodiment of the present invention, the wireless module further comprises a resin coating covering the substrate and the wireless IC chip, and the third antenna is exposed from the resin coating.

In a preferred embodiment of the present invention, the wireless module further comprises a case covering the wireless IC chip.

In a preferred embodiment of the present invention, the wireless module further comprises a connector provided on the substrate and connected to the wireless IC chip via a transmission path for transmission/reception signals.

According to this arrangement, mounting of the wireless module on a mount object is performed by connecting to the mount object the ends of the terminals extending from the substrate in the in-plane direction of the substrate. This arrangement saves space in mounting the wireless module.

Other features and advantages of the present invention will become more apparent from detailed description given below with reference to the accompanying drawings.

DESCRIPTION OF THE PREFERRED EMBODIMENTS

Preferred embodiments of the present invention are described below with reference to the accompanying drawings.

Figure 1:
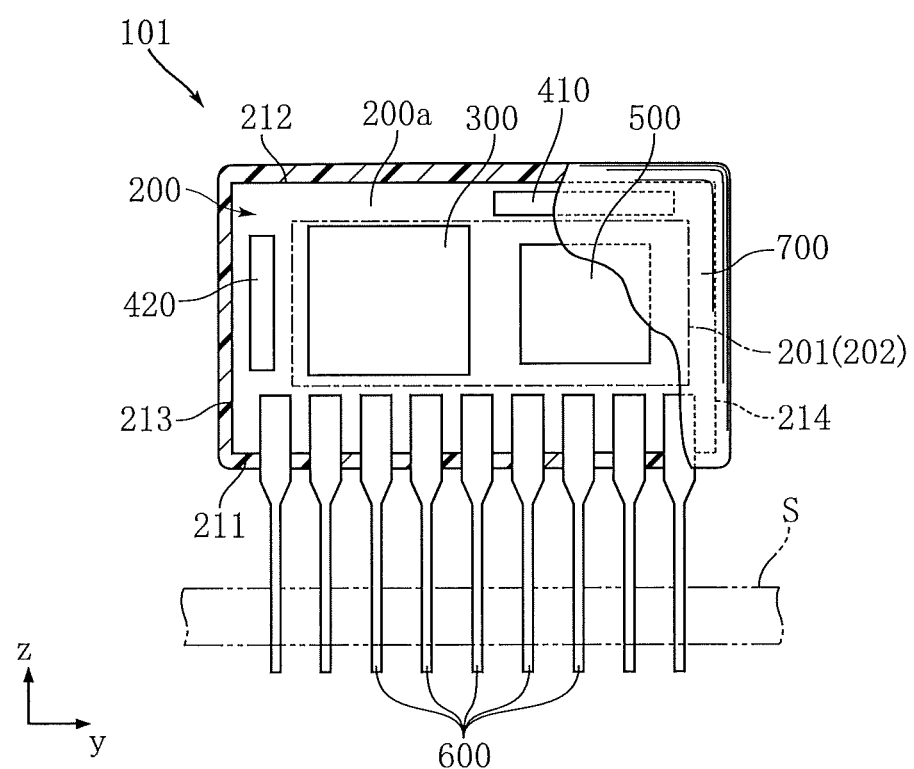
FIG. 1 is a front view, partially in section, showing a first embodiment of a wireless module according to the present invention.
Figure 2:
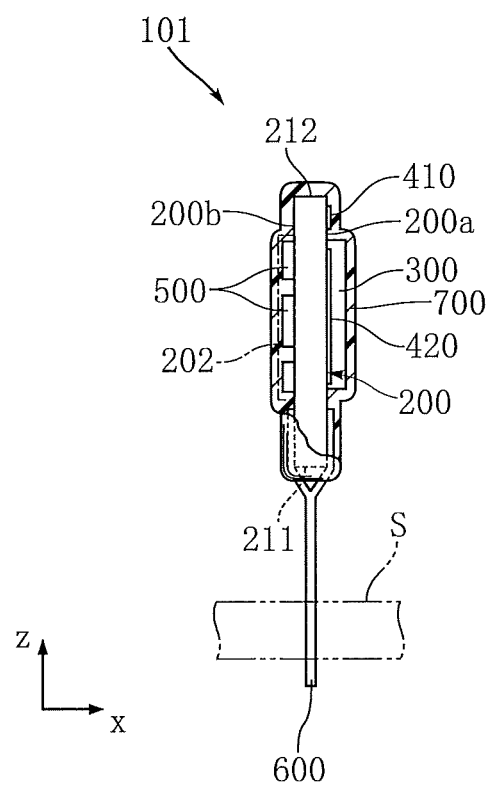
FIG. 2 is a left side view, partially in section, of the wireless module shown in FIG. 1.

FIGS. 1 and 2 show a first embodiment of a wireless module according to the present invention. The wireless module 101 of this embodiment includes a substrate 200, a wireless IC chip 300, antennas 410, 420 as a transmitter-receiver, electronic devices 500, a plurality of lead terminals 600 and a resin coating 700. The wireless module 101 is an electronic component to be mounted on a mount object such as a circuit board.

The substrate 200 is an insulating substrate made of e.g. glass epoxy resin and rectangular as a whole. The contour of the substrate is made up of two pairs of parallel edges (four edges), i.e., a first through a fourth edges 211-214 . The first edge 211 and the second edge 212, which are parallel to each other, extend in the direction y perpendicular to the direction x corresponding to the thickness direction of the substrate 200. The third edge 213 and the fourth edge 214, which are parallel to each other, extend in the direction z perpendicular to both of the direction x and the direction y and connected to the first edge 211 and the second edge 212 at the ends.

The substrate 200 has a wiring pattern (not shown) formed on it. The wiring pattern is made of a highly conductive material such as Cu. The wireless IC chip 300, the electronic devices 500 and the terminals 600 are electrically connected to each other appropriately via the wiring pattern.

The antennas 410 and 420 are provided on the first surface 200a of the substrate 200, which is the surface on the first side in the thickness direction (direction x). In this embodiment, the antennas 410, 420 are e.g. a pattern antenna and formed along with the wiring pattern on the substrate 200. The antenna 410 is arranged at a position offset toward the second edge 212 in the direction z and elongated in the direction y. The antenna 410 is also offset toward the fourth edge 214 in the direction y. The antenna 420 is arranged at a position offset toward the third edge 213 in the direction y and elongated in the direction z.

Each of the antennas 410 and 420 is connected to the wireless IC chip 300 via a transmission path (not shown) for transmission/reception signals. The transmission path is a portion through which transmission/reception signals pass and made of e.g. a metal having a relatively low resistance. The transmission path may be provided by a part of the wiring pattern. Alternatively, when the substrate 200 is a multilayer substrate, the transmission path may be provided by a metal film pattern formed on the multilayer substrate.

The wireless IC chip 300 is provided for processing transmission/reception signals of predetermined frequencies and includes a predetermined signal processing circuit. The wireless IC chip 300 is mounted on the first surface 200a on the first side of the substrate 200. The wireless IC chip 300 is arranged in a first region 201 of the first surface 200a, which excludes the region in which the antennas 410, 420 are arranged.

The electronic devices 500 are semiconductor devices including e.g. a control IC for controlling the entirety of the wireless module 101, a chip resistor or a capacitor. The electronic devices 500 are surface-mounted on the first surface 200a of the substrate 200 and a second surface 200b opposite to the first surface 200a. Specifically, the electronic devices 500 are mounted in the first region 201 of the first surface 200a and in the second region 202 of the second surface 200b which overlaps the first region 201 as viewed in the thickness direction (the direction x).

The terminals 600 are provided for performing signal exchange with e.g. the circuit board on which the wireless module 101 is mounted. Each terminal 600 is made of e.g. Cu, Ni or alloys of these and projects from the substrate 200. In this embodiment, the terminals 600 extend in an in-plane direction of the substrate 200. Specifically, the terminals 600 are arranged along the first edge 211 of the substrate 200, and each of the terminals .extends from the first edge 211 toward a first side in the direction z.

The resin coating 700 covers the substrate 200, the wireless IC chip 300, the antennas 410, 420, the electronic devices 500 and a part of each terminal 600 to protect these parts and prevent the wireless module 101 from being converted or disassembled. For instance, the resin coating 700 is made of black thermoplastic resin or thermosetting resin.

The resin coating 700 is formed by performing dip molding using powdered resin with respect to the substrate 200 on which a wireless IC chip 300, antennas 410, 420 and electronic devices 500 are mounted. In this embodiment, after the substrate 200 on which the wireless IC chip 300 and so on are mounted is heated, the substrate 200 is dipped into powdered resin. In this process, the entirety of substrate 200 is dipped, with the terminals 600 or a frame (not shown) to which the terminals 600 are connected held. The powdered resin coming into contact with the heated substrate 200 melts and adheres to the substrate 200 and so on. By repeating this process several times, the resin coating 700 is formed.

The advantages of the wireless module 101 are described below.

As shown in FIGS. 1 and 2, to mount the wireless module 101 of this embodiment on a circuit board (an example of a mount object), the ends of the terminals 600 extending from the substrate 200 in the in-plane direction of the substrate 200 are connected to the circuit board S. This arrangement saves space in mounting the wireless module 101.

Mounting to the circuit board S by using the terminals 600 extending in the in-plane direction of the substrate 200 allows the substrate 200 to be spaced apart from the circuit board. This allows the parts such as the wireless IC chip 300 or the electronic devices 500 to be mounted on both surfaces 200a and 200b of the substrate 200. This contributes to size reduction of the wireless module 101.

Since the antennas 410, 420 arranged on the substrate 200 are distant from the circuit board S, a high degree of freedom is provided with respect to the three-dimensional arrangement of the antennas. By arranging the antennas 410, 420 spaced apart from each other, the radio wave directivity can be widened, which enhances communication quality of the wireless module 101.

The antenna 410 extends in the direction y (horizontal direction in FIG. 1), whereas the antenna 420 extends in the direction z (vertical direction in FIG. 1). This arrangement allows the antenna 410 and the antenna 420 to have different radio wave directivities. This arrangement contributes to enhancement of communication quality of the wireless module 101.

According to the wireless module 101 of this embodiment, flow soldering can be employed as a technique for mounting the module on the circuit board S, which enhances efficiency of the mounting work.

FIGS. 3-8 show other embodiments of the present invention. In these figures, the elements that are identical or similar to those of the foregoing embodiment are designated by the same reference signs as those used for the foregoing embodiment.

Figure 3:
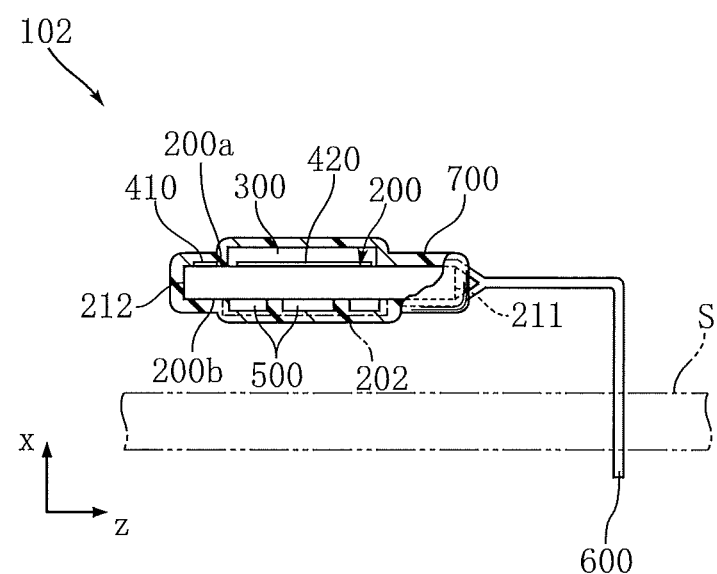
FIG. 3 is a view corresponding to FIG. 2, showing a second embodiment of a wireless module according to the present invention.

FIG. 3 shows a second embodiment of a wireless module according to the present invention. The wireless module 102 of this embodiment differs from that of the first embodiment in structure of the terminals 600. In this embodiment, each of the terminals 600 is bent so that the region from an intermediate portion to the end extends in the thickness direction of the substrate 200 (direction x).

To mount the wireless module 102 of this embodiment on the circuit board S, the ends of the terminals 600 extending from the substrate 200 in the in-plane direction of the substrate 200 are connected to the circuit board S. This arrangement saves space in mounting the wireless module 102.

Each terminal 600 is bent so that the region from an intermediate portion to the end extends in the thickness direction (direction x) of the substrate 200. Thus, when the wireless module 102 is mounted on the circuit board S, the substrate 200 faces the circuit board S with a predetermined distance from the circuit board S. This embodiment allows arrangement of a ground plane on the circuit board S at a position facing the substrate 200. Thus, a high degree of freedom is provided with respect to the arrangement of a ground plane, which contributes to enhancement of communication quality.

Figure 4:
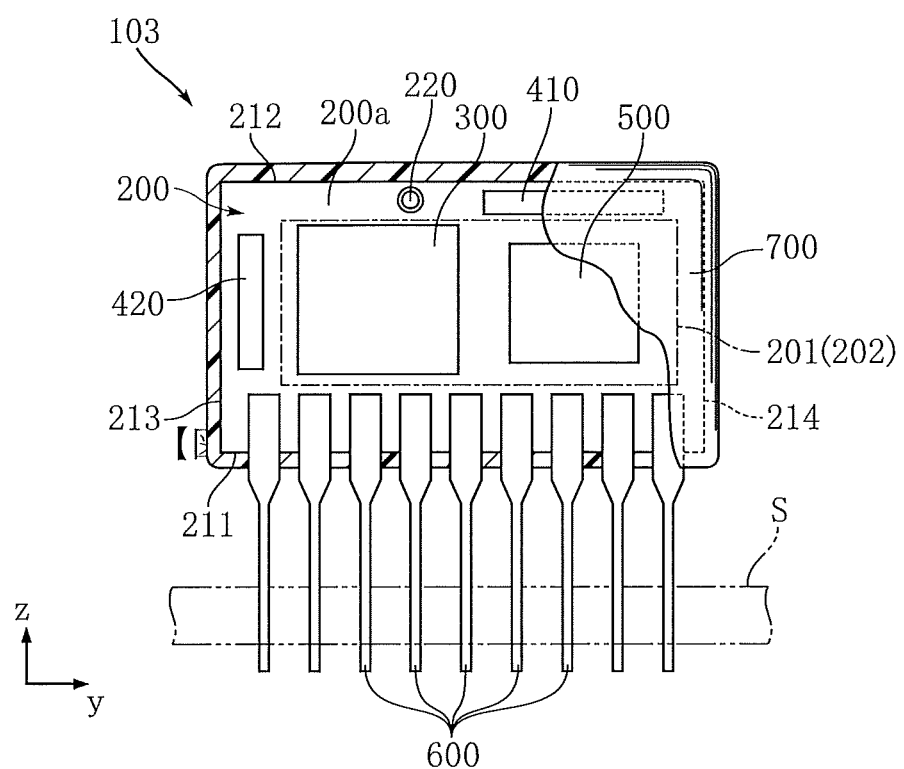
FIG. 4 is a front view, partially in section, showing a third embodiment of a wireless module according to the present invention.

FIG. 4 shows a third embodiment of a wireless module according to the present invention. The wireless module 103 of this embodiment is provided with a connector 220, which is the difference from that of the first embodiment.

The connector 220 is provided at an appropriate position on the substrate 200 and may be arranged close to the wireless IC chip 300. When a separately prepared antenna (not shown) is mounted on the circuit board S, the connector 220 is used for connecting a terminal portion that is to be connected to that antenna via a transmission line (not shown) for transmission/reception signals. The connector 220 is connected to the wireless IC chip 300 via a transmission path (not shown) for transmission/reception signals. The transmission path, made of e.g. a metal having a relatively low resistance, is a portion through which transmission/reception signals pass. The transmission path may be provided by a part of the wiring pattern. Alternatively, when the substrate 200 is a multilayer substrate, the transmission path may be provided by a metal film pattern formed on the multilayer substrate.

The connector 220 is not covered by the resin coating 700 and exposed to the outside. This arrangement is obtained by masking the connector 220 in forming the resin coating 700.

To mount the wireless module 103 of this embodiment on the circuit board S, the ends of the terminals 600 extending from the substrate 200 in the in-plane direction of the substrate 200 are connected to the circuit board S. This arrangement saves space in mounting the wireless module 103.

According to this embodiment, transmission/reception can be performed also by an antenna provided separately from the wireless module 103. This arrangement is advantageous for enhancing communication quality of the wireless module 103.

Figure 5:
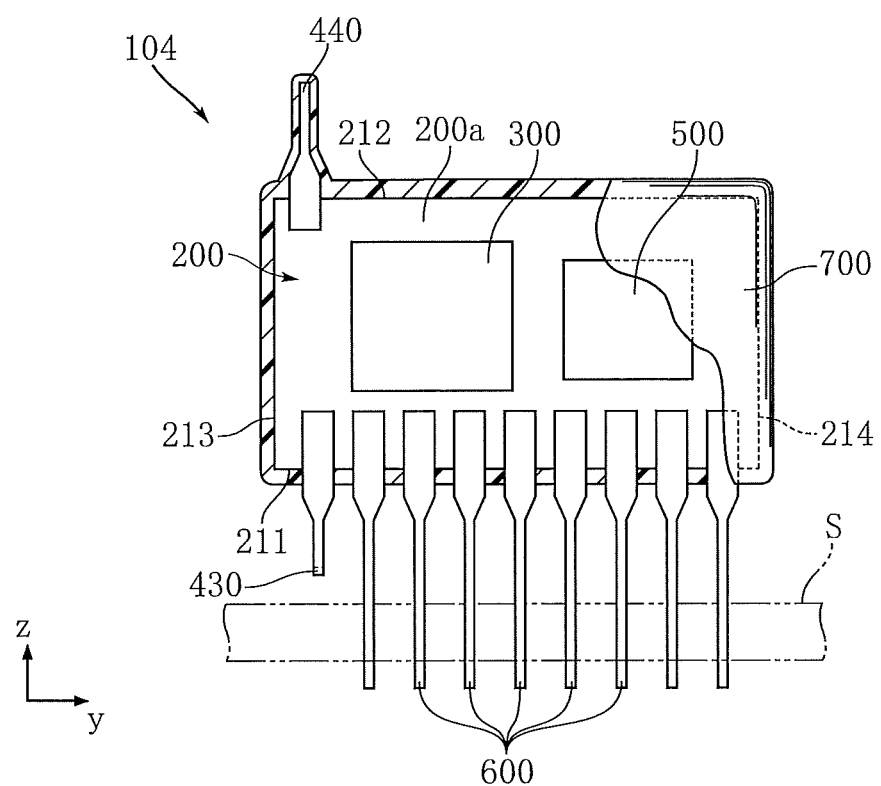
FIG. 5 is a front view, partially in section, showing a fourth embodiment of a wireless module according to the present invention.
Figure 6:
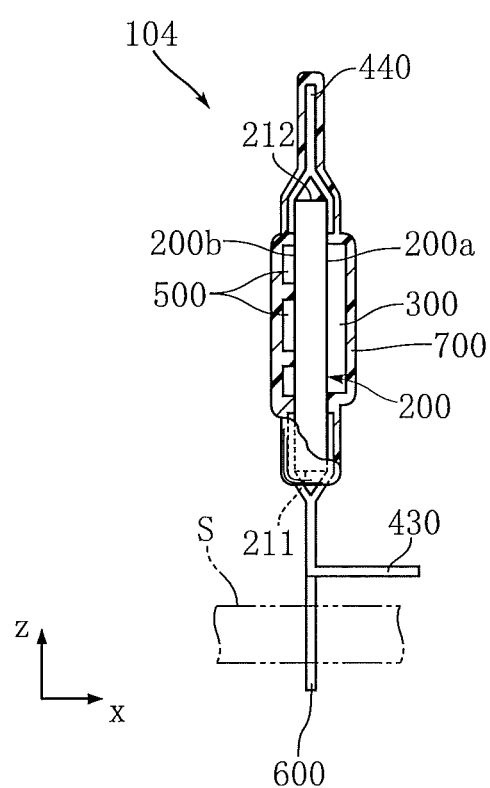
FIG. 6 is a left side view, partially in section, of the wireless module shown in FIG. 5.

FIGS. 5 and 6 show a fourth embodiment of a wireless module according to the present invention. The wireless module 104 of this embodiment differs from that of the first embodiment in structure of the antenna as a transmitter-receiver.

In this embodiment, antennas 430 and 440 are provided on the substrate 200. The antenna 430 projects from the first edge 211 of the substrate 200 toward a first side in the direction z. The antenna 440 projects from the second edge 212 toward a second side in the direction z. These antennas 430, 440 can be made of the same material as that of the terminals 600. The antenna 430 is bent so that the region from an intermediate portion to the end extends in the thickness direction of the substrate 200 (direction x). Although the antenna 440 is covered by the resin coating 700 in this embodiment as shown in FIGS. 5 and 6, the antenna 440 may be exposed.

To mount the wireless module 104 of this embodiment on the circuit board S, the ends of the terminals 600 extending from the substrate 200 in the in-plane direction of the substrate 200 are connected to the circuit board S. This arrangement saves space in mounting the wireless module 104.

The antenna 430 extends in the direction y (horizontal direction in FIG. 6), whereas the antenna 440 extends in the direction z (vertical direction in FIG. 6). This arrangement allows the antenna 430 and the antenna 440 to have different radio wave directivities. This arrangement contributes to enhancement of communication quality of the wireless module 104.

Figure 7:
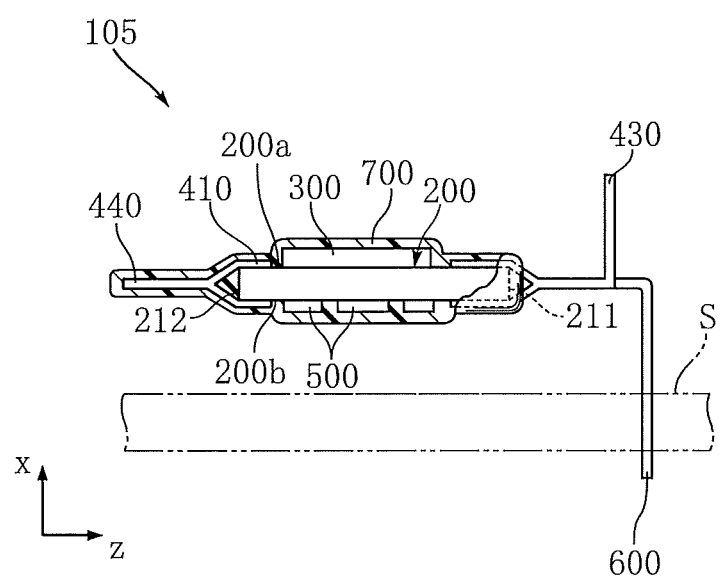
FIG. 7 is a view corresponding to FIG. 2, showing a fifth embodiment of a wireless module according to the present invention.

FIG. 7 shows a fifth embodiment of a wireless module according to the present invention. The wireless module 105 of this embodiment differs from that of the fourth embodiment in structure of the terminals 600. In this embodiment, each terminal 600 is bent so that the region from an intermediate portion to the end extends in the thickness direction (direction x) of the substrate 200.

To mount the wireless module 102 of this embodiment on the circuit board S, the ends of the terminals 600 extending from the substrate 200 in the in-plane direction of the substrate 200 are connected to the circuit board S. This arrangement saves space in mounting the wireless module 105.

Each terminal 600 is bent so that the region from an intermediate portion to the end extends in the thickness direction (direction x) of the substrate 200. Thus, when the wireless module 105 is mounted on the circuit board S, the substrate 200 faces the circuit board S with a predetermined distance from the circuit board S. The antenna 430 extends in the direction x (vertical direction in FIG. 7), whereas the antenna 440 extends in the direction z (horizontal direction in FIG. 7). This arrangement allows the antenna 430 and the antenna 440 to have different radio wave directivities. This arrangement contributes to enhancement of communication quality of the wireless module 105.

Figure 8:
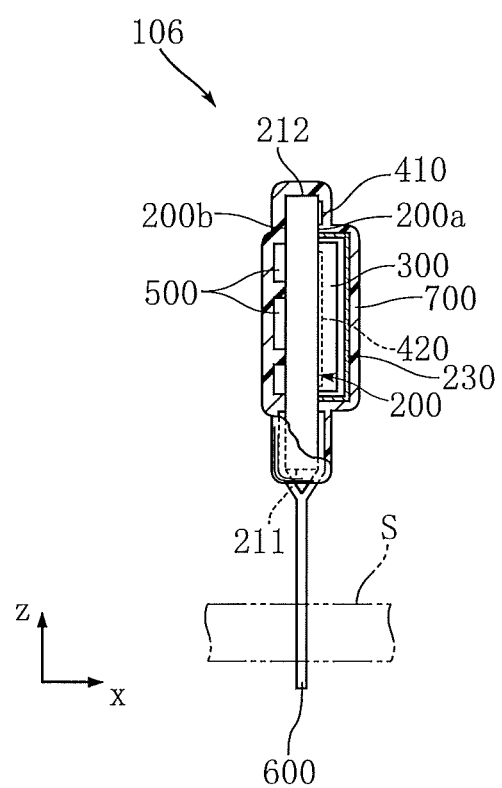
FIG. 8 is a view corresponding to FIG. 2, showing a sixth embodiment of a wireless module according to the present invention.

FIG. 8 shows a sixth embodiment of a wireless module according to the present invention. The wireless module 106 of this embodiment includes a case 230, which is the difference from mainly the first embodiment.

The case 230 is made of a metal and provided on the first surface 200a of the substrate 200. The case 230 covers the wireless IC chip 300. The antennas 410 and 420 are not covered by the case 230. The structure including the case 230 prevents radio signals from leaking from the wireless IC chip 300 to the outside.

The wireless module according to the present invention is not limited to the foregoing embodiments. The specific structure of the wireless module according to the present invention can be varied in design in many ways.

Although a pattern antenna is described as an example of antennas 410, 420 (transmitter-receiver) provided on the substrate 200 in the foregoing embodiments, the present invention is not limited to this. Other kinds of antennas such as a chip antenna maybe employed as the antennas on the substrate.

The invention claimed is:

1. A wireless module comprising:
a substrate having an obverse surface;
a semiconductor chip provided on the obverse surface of the substrate, the semiconductor chip processing transmission/reception signals transmitted by wireless;
a first antenna electrically connected to the semiconductor chip and at least partly extending along the obverse surface of the substrate;
a plurality of terminals disposed along a common edge of the substrate, each of the plurality of terminals having an extension elongated in a first direction that is parallel to the obverse surface of the substrate and proceeds away from the substrate; and
a resin portion provided on the obverse surface of the substrate, the resin portion covering the semiconductor chip, the first antenna, and the plurality of the terminals,
wherein the extension of each of the plurality of terminals includes a fixing portion located apart from the substrate and used for attachment to a circuit board,
a part of each of the first antenna and the plurality of terminals protrudes across the common edge of the substrate into a space, as viewed in a normal direction perpendicular to the obverse surface of the substrate, and
the common edge of the substrate is located between the space and the semiconductor chip in the first direction, and none of the space overlaps the resin portion as viewed in the normal direction.

2. The wireless module according to claim 1, wherein the first antenna includes a projecting portion and a base portion, the projecting portion projecting from the substrate in a direction parallel to the obverse surface of the substrate, the base portion being disposed on the substrate.

3. The wireless module according to claim 2, wherein the projecting portion of the first antenna is at least partly elongated in the first direction.

4. The wireless module according to claim 2, wherein the resin portion covers at least the base portion of the antenna.

5. The wireless module according to claim 4, wherein a part of the first antenna is exposed from the resin portion.

6. The wireless module according to claim 3, further comprising a second antenna, wherein the second antenna is electrically connected to the semiconductor chip, at least partly extends along the obverse surface of the substrate, and includes a projecting portion projecting in a second direction opposite to the first direction.

7. The wireless module according to claim 3, wherein the projecting portion of the first antenna includes an end part elongated in a direction other than the first direction.

8. The wireless module according to claim 1, wherein the first antenna is elongated in parallel to the common edge of the substrate.

9. The wireless module according to claim 8, further comprising a second antenna, wherein the second antenna is electrically connected to the semiconductor chip and elongated perpendicularly to the common edge of the substrate.

10. The wireless module according to claim 9, wherein the first antenna and the second antenna are different in radio wave directivity from each other.

11. The wireless module according to claim 1, wherein the first antenna is elongated perpendicularly to the common edge of the substrate.

12. The wireless module according to claim 1, wherein the first antenna and the plurality of the terminals are at least partly elongated in parallel to each other.

13. A wireless system comprising:
a circuit board including an obverse surface perpendicular to a first normal direction;
a substrate including an obverse surface perpendicular to a second normal direction that is perpendicular to the first normal direction;
a semiconductor chip provided on the obverse surface of the substrate, the semiconductor chip processing transmission/reception signals transmitted by wireless;
a first antenna electrically connected to the semiconductor chip and at least partly extending along the obverse surface of the substrate;
a plurality of terminals disposed along a common edge of the substrate, each of the plurality of terminals having an extension elongated in a first direction that is parallel to the obverse surface of the substrate and proceeds away from the substrate; and
a resin portion provided on the obverse surface of the substrate, the resin portion covering the semiconductor chip, the first antenna, and the plurality of the terminals,
wherein the extension of each of the plurality of terminals is attached to the circuit board in a manner such that an entirety of the substrate is spaced apart from the circuit board,
a part of each of the first antenna and the plurality of terminals protrudes across the common edge of the substrate into a space, as viewed in the second normal direction, and
the common edge of the substrate is located between the space and the semiconductor chip in the first direction, and none of the space overlaps the resin portion as viewed in the second normal direction.

14. The wireless system according to claim 13, wherein the first antenna includes a projecting portion and a base portion, the projecting portion projecting from the substrate in a direction parallel to the obverse surface of the substrate, the base portion being disposed on the substrate.

15. The wireless system according to claim 14, wherein the resin portion covers at least the base portion of the first antenna.

16. The wireless system according to claim 15, wherein a part of the first antenna is exposed from the resin portion.

17. The wireless system according to claim 14, wherein the projecting portion of the first antenna is at least partly elongated toward the circuit board.

18. The wireless system according claim 13, wherein the first antenna is elongated in parallel to the obverse surface of the circuit board.

19. The wireless system according claim 13, wherein the first antenna is elongated perpendicularly to the obverse surface of the circuit board.

20. The wireless system according to claim 13, wherein the first antenna and the plurality of the terminals are at least partly elongated in parallel to each other.

* * * * *